United States Patent [19]
Kimura

[11] Patent Number: 5,012,134
[45] Date of Patent: Apr. 30, 1991

[54] DC BOOTSTRAPPED UNITY GAIN BUFFER

[75] Inventor: Robert B. Kimura, Colorado Springs, Colo.

[73] Assignee: Hewlett-Packard Company, Palo Alto, Calif.

[21] Appl. No.: 487,556

[22] Filed: Mar. 2, 1990

[51] Int. Cl.$^5$ .................... H03K 19/02; H03K 19/094
[52] U.S. Cl. ..................................... 307/446; 307/542; 307/482; 307/570; 307/296.3
[58] Field of Search ............... 307/443, 446, 451, 542, 307/482, 570, 296.3

[56] References Cited

U.S. PATENT DOCUMENTS 4,760,293  7/1988  Hebenstreit ........................ 307/570
4,857,772  8/1989  Herndon ............................. 307/570

OTHER PUBLICATIONS

P. Horowitz, et al., The Art of Electronics, New York, Press Syndicate of the University of Cambridge, 1983, p. 229.

Primary Examiner—Stanley D. Miller
Assistant Examiner—Margaret Rose Wambach

[57]  ABSTRACT

A method and apparatus for a buffer for providing approximately unity gain to an input signal is shown to include a field effect transistor, wherein the input signal is applied to the gate of the field effect transistor, a first bias source such as a current source, connected to the field effect transistor, the first bias source having a first bias value, a transistor, having its base connected to the field effect transistor, a second bias source such as a current source connected to the field effect transistor, the second bias source having a bias value greater than the first bias value and a resistor, connected between the first bias source and the transistor for maintaining the drain-source voltage of the field effect transistor at a relatively constant value.

9 Claims, 2 Drawing Sheets

DC BOOTSTRAPPED UNITY GAIN BUFFER

BACKGROUND OF THE INVENTION

The present invention relates to the field of electronic buffers and more particularly to unity gain buffers wherein a field effect transistor (FET) is utilized as the active amplifier element.

BACKGROUND OF THE INVENTION

In electronic circuit design, it has been known to utilize buffer devices in various situations requiring signal or circuit isolation. For example, buffers have been utilized to isolate low current micro-processors from higher current bus systems. In some cases where buffers have been used, it has been desirable to maintain signal levels relatively constant. In such situations it has been known to use unity gain buffers. Typically such buffers include an active element such as a bi-polar transistor or a field-effect transistor (FET) which provide a gain of one to a given signal, i.e. no amplification. In electronic designs which are to be constructed as integrated circuits, it is desirable that the active element be an FET since these devices can generally be constructed within a small chip area.

In an ideal buffer, utilizing an FET as the active element, the FET is connected in a so-called source follower arrangement wherein the buffer input is the gate of the FET and the buffer output is the source of the FET. The FET drain is generally connected to a fixed voltage source. In such an ideal buffer, gain is equal to unity. Unfortunately, in actual practice, the gain of such a circuit is less than one because of the finite transconductance and finite drain resistance of the FET. Generally, the drain resistance, which can be viewed as being parallel with the output load resistance, will limit the gain because the transconductance of the FET is not infinite. In such circuits, typically the FET source is biased with a current source to minimize load.

A commonly used technique, to rectify the non-ideal FET buffer situation, is the addition of a transistor to the output of the buffer where the transistor is connected in a so-called emitter follower arrangement. Such a circuit is depicted in FIG. 1. As shown, buffer 10 includes an FET 12 connected in a source follower arrangement. A current source 14 is connected to bias the source of FET 12. A transistor 16 has been added in an emitter follower arrangement wherein the emitter of transistor 16 is biased by current source 18. In this arrangement, transistor 16 buffers the source of FET 12 from the output load resistance 20. Current source 18 is used to maximize the resistance when looking into the base of transistor 16, which in turn reduces the load on the source of FET 12. The construction of buffer 10 can yield a buffer having a gain of approximately 0.98.

Such a "unity" gain buffer might be acceptable if the transconductance and drain resistance of FET 12 were constant with temperature and did not vary from FET to FET. In reality, however, the gain of buffer 10 will drift with temperature and will vary as FET parameters vary from element to element.

P. Horowitz, et al., The Art Of Electronics, New York, Press Syndicate of The University of Cambridge, 1983, p. 229 indicates that many of the characteristics of FETs show great process spread. For example, drain resistance when the FET is "on" can vary from one ohm to 10 kilo ohms and further that transconductance can vary from 500 micro mhos to 3,000 micro mhos.

Consequently, a need exists for a unity gain buffer utilizing an FET as the active element wherein temperature and manufacturing variances will not have significant effects on buffer gain.

SUMMARY OF THE INVENTION

The advantages of the invention are achieved in a method and apparatus for a buffer for providing approximately unity gain to an input signal is shown to include a field effect transistor, wherein the input signal is applied to the gate of the field effect transistor, a first bias source such as a current source, connected to said field effect transistor, the first bias source having a first bias value, a transistor, having its base connected to the field effect transistor, a second bias source such as a current source connected to the field effect transistor, the second bias source having a bias value greater than said first bias value and a resistor, connected between the second bias source and the transistor for maintaining the drain-source voltage of the field effect transistor at a relatively constant value, which is independent of the input voltage.

By maintaining the drain-source voltage at a substantially constant value, operation of the buffer is relatively temperature independent, i.e. the gain of the buffer circuit remains relatively stable. Additionally, manufacturing variances from FET to FET will not have significant effects on the near unity gain of the buffer circuit.

BRIEF DESCRIPTION OF THE DRAWINGS

The present invention will be better understood, and its numerous objects and advantages will become apparent by reference to the following detailed description of the invention when taken in conjunction with the following drawings, in which.

DETAILED DESCRIPTION OF THE PREFERRED EMBODIMENT

Figure 2:
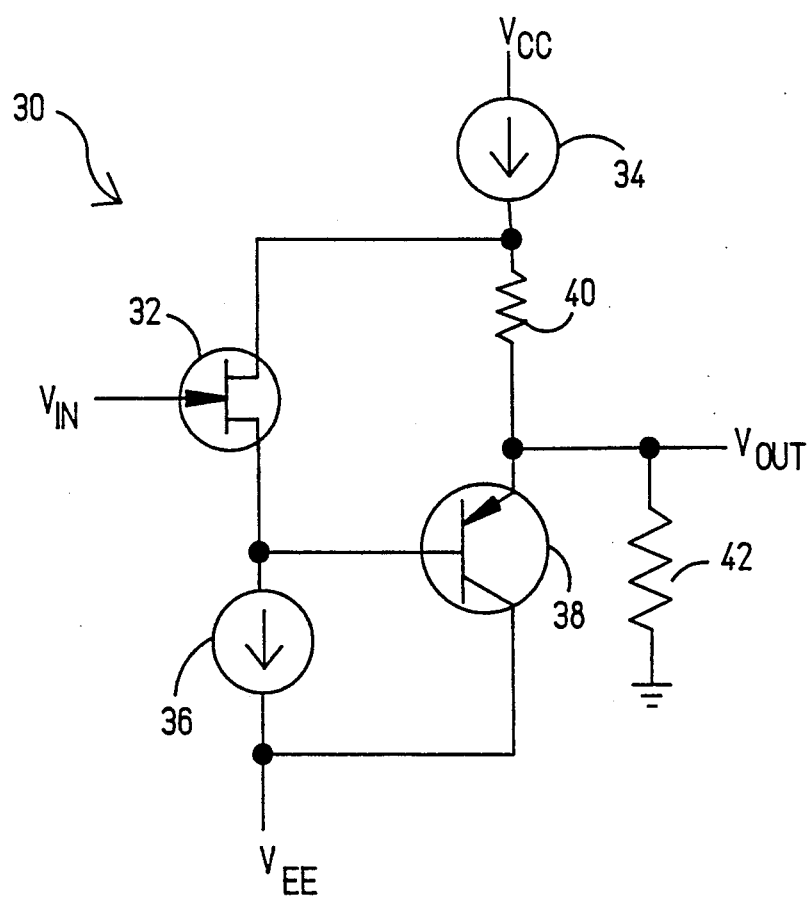
FIG. 2 is a schematic diagram of a unity gain buffer in accordance with the present invention.

A new and novel unity gain buffer circuit 30 is shown in FIG. 2. Circuit 30 includes as the active element FET 32. The gate of FET 32 is utilized as the input for buffer 30. The drain of FET 32 is connected to the output of current source 34. Current source 34 serves as a biasing source in the circuit of buffer 30. The input of current source 34 is connected to a supply voltage $V_{cc}$. The source of FET 32 is connected to the input of current source 36, which also serves as a bias source in buffer circuit 30. The output of bias source 36 is connected to a supply voltage $V_{ce}$. In the preferred embodiment supply voltage $V_{cc}$ is more positive than supply voltage $V_{ce}$. Also in the preferred embodiment, the bias or current value of current source 34 is greater than the bias or current value of current source 36.

A transistor 38 is connected in buffer 30 in an emitter follower arrangement, wherein the base of transistor 38 is connected to the source of FET 32, and the collector of transistor 38 is connected to the output of current source 36. The emitter of transistor 38 is connected to the drain of FET 32 through resistor 40. A resistor 42 is shown as being connected to the output of buffer 30, however, resistor 42 is representative of load resistance.

Figure 1:
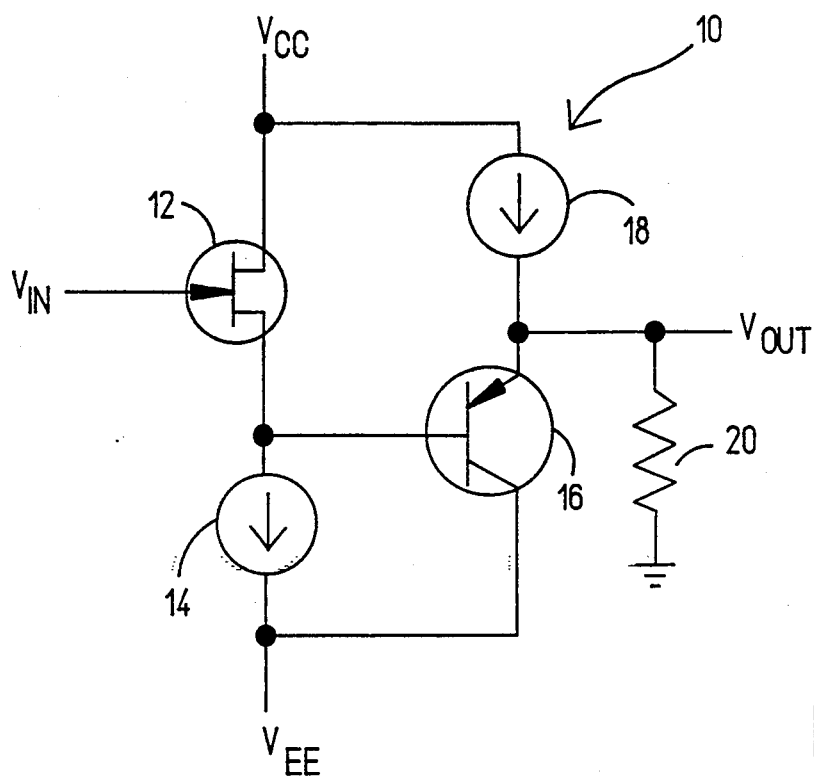
FIG. 1 is a schematic diagram of a prior art unity gain buffer.

Utilizing the circuit shown in FIG. 2, the drain of FET 32 is DC (direct current) bootstrapped in relation to the source and the output load is not increased. As $V_{in}$ varies, the source voltage and the drain voltage will also vary as compared to buffer 10 (FIG. 1) where the drain voltage was a constant $V_{cc}$. In other words, as the source and drain voltage vary a constant voltage difference (DC bootstrap) will exist therebetween. It has been found that buffer 30 yields a more accurate near unity gain which is relatively temperature independent.

Since current source 34 is greater than current source 36, the drain voltage of FET 32 is at a constant voltage difference from the source voltage. That is, the difference in voltage between drain and source is equal to the voltage drop across resistor 40 and transistor 38, regardless of the signal voltage applied to the gate of FET 32. Since drain voltage is no longer constant, drain resistance will have a significantly lesser effect on buffer gain. It will be noted that transistor 38 may also be temperature dependant in relation to its collector-base junction. In an especially preferred embodiment of the present invention, the values of current sources 34 and 36 and the value of resistor 40 are chosen such that transistor 38 operates in its active region.

In operation, as $V_{in}$ varies the source voltage of FET 32 will vary or follow. As the source voltage varies, the biasing of transistor 38 will vary, which in turn varies the current passing through transistor 38. In other words, as the voltage applied to the base of transistor 38 varies the emitter voltage will follow. As the emmitter voltage varies, concurrently, $V_{out}$ and the drain voltage will vary.

In order to better understand operation of the present invention, consider the following sample values for buffer 30. Assume that current source 34 is a 15 mA current source and that current source 36 is a 5 mA current source. Further assume that resistor 40 is a 400 ohm resistor and that load resistor 42 represents one kilo ohm of load resistance. In such a circuit, 5 mA of current will flow through FET 32 and 10 mA of current will flow through resistor 40 and from emitter to collector in transistor 38, depending of course on the biasing of the gate of FET 32. At maximum bias, approximately 0.7 volts will exist across transistor 38 and approximately 4 volts will exist across resistor 40. The drain to source voltage of FET 32 would therefore be 4.7 volts. In other words, the difference between drain and source voltages is equal to the base to emitter voltage of transistor 38 plus the current value of current source 34 minus the current value of current source 36 multiplied by the resistance value of resistor 40.

Figure 3:
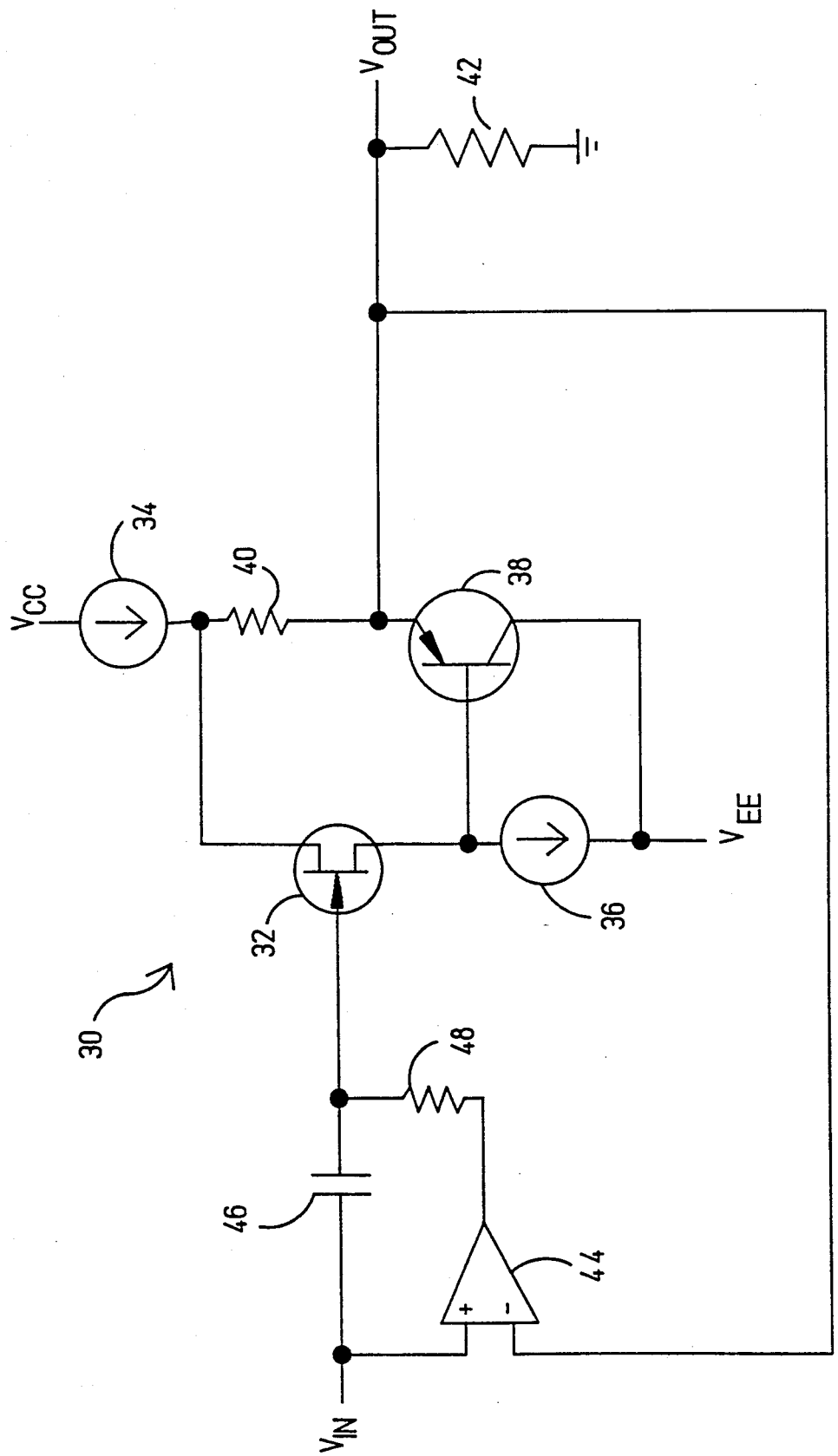
FIG. 3 is a schematic diagram of the buffer shown in FIG. 2 incorporated into one application.

Up to this point, we have not considered the situation where the input voltage to buffer 30 is 0. In such situations typically a DC offset voltage will exist at the output of buffer 30. A circuit for compensating such DC offset voltage is depicted in FIG. 3. As shown, the output of buffer 30 is connected to the negative input of differential amplifier 44. The input voltage is applied to capacitor 46 a well as the positive input of differential amplifier 44. Capacitor 46 is also connected to the gate of FET 32. The output of differential amplifier 44 is connected through resistor 48 to the gate of FET 32. The output of differential amplifier 44 serves to remove the DC offset voltage from the buffer output. Consequently, $V_{out}$ will be substantially identical to $V_{in}$, i.e. the DC offset is approximately zero.

While the invention has been described and illustrated with reference to specific embodiments, those skilled in the art will recognize that modification and variations may be made without departing from the principles of the invention as described herein above and set forth in the following claims.

What is claimed is:

1. A buffer for providing approximately unity gain to a signal applied thereto, comprising:
    a field effect transistor, wherein said signal is applied to the gate of said field effect transistor, said field effect transistor having a drain-source voltage;
    a first current source, connected to said field effect transistor, said first current source having a first current value;
    a transistor, having a base connected to said field effect transistor;
    a second current source, connected to said field effect transistor, said second current source having a current value greater than said first current value; and
    a resistor, connected between said second current source and said transistor for maintaining said drain-source voltage at a relatively constant value and wherein said drain-source voltage is relatively independent of said signal.

2. The buffer of claim 1, wherein said field effect transistor is connected in a source follower arrangement.

3. The buffer of claim 1, wherein said transistor is connected in an emitter follower arrangement.

4. The buffer of claim 1, wherein said field effect transistor has a drain and a source, said second bias source being connected to said drain and said first bias source being connected to said source.

5. The buffer of claim 1, wherein said transistor has a active region, wherein said resistor has a resistance value and wherein said first and second bias values and said resistance value are selected so that said transistor will operate in said active region.

6. The buffer of claim 1 further comprising a compensator for compensating said buffer for DC offset voltage.

7. A method for providing approximately unity gain to a signal applied thereto, comprising the steps of:
    applying said signal to the gate of a field effect transistor, said field effect transistor having a drain-source voltage;
    current biasing the source of said field effect transistor by applying a first current value;
    connecting the base of a transistor to the source of said field effect transistor;
    connecting a resistor between the drain of said field effect transistor and the emitter of said transistor; and
    current biasing said drain and said resistor by applying a second current value, wherein said second current value is greater than said first current value so that said drain-source voltage is maintained at a relatively constant value and wherein said drain-source voltage is relatively independent of said signal.

8. The method of claim 7, wherein said transistor has a active region, wherein said resistor has a resistance value and wherein said first and second bias values and said resistance value are selected so that said transistor will operate in said active region.

9. The method of claim 7 further comprising the step of compensating said signal for DC offset voltage.

* * * * *